(12) United States Patent
Cho et al.

(10) Patent No.: US 10,800,156 B2
(45) Date of Patent: Oct. 13, 2020

(54) FABRICATING METHOD OF A PATTERN INCLUDING STRETCHING A SUBSTRATE

(71) Applicant: CHANGWON NATIONAL UNIVERSITY Industry Academy Cooperation Corps, Changwon-si, Gyeongsangnam-do (KR)

(72) Inventors: Young Tae Cho, Daejeon (KR); Yoon Gyo Jung, Changnyeong-gun (KR); Yeon Ho Jeong, Gimhae-si (KR); Seung Hang Shin, Changwon-si (KR); Hyun Min Choi, Gimhae-si (KR)

(73) Assignee: CHANGWON NATIONAL UNIVERSITY INDUSTRY ACADEMY COOPERATION CORPS, Gyeongsangnam-Do (KR)

( * ) Notice: Subject to any disclaimer, the term of this patent is extended or adjusted under 35 U.S.C. 154(b) by 0 days.

(21) Appl. No.: 16/308,548

(22) PCT Filed: Jun. 19, 2018

(86) PCT No.: PCT/KR2018/006886
§ 371 (c)(1),
(2) Date: Dec. 10, 2018

(87) PCT Pub. No.: WO2018/236118
PCT Pub. Date: Dec. 27, 2018

(65) Prior Publication Data
US 2020/0101716 A1    Apr. 2, 2020

(30) Foreign Application Priority Data
Jun. 20, 2017    (KR) ........................ 10-2017-0077727

(51) Int. Cl.
*B41F 5/02*    (2006.01)
*B41F 19/00*    (2006.01)
(Continued)

(52) U.S. Cl.
CPC .............. *B41F 5/02* (2013.01); *B41F 19/005* (2013.01); *H01L 21/02288* (2013.01); *H01L 21/288* (2013.01); *H05K 3/1275* (2013.01)

(58) Field of Classification Search
CPC .... B41F 5/02; B41F 19/005; H01L 21/02288; H01L 21/288; H05K 3/1275
(Continued)

(56) References Cited

FOREIGN PATENT DOCUMENTS

| JP | 2002-184719 A | 6/2002 |
|---|---|---|
| KR | 10-2006-0066309 A | 6/2006 |

(Continued)

OTHER PUBLICATIONS

English language machine translation of KR 10-0840152 B1, publication date Jun. 23, 2008. (Year: 2008).*
(Continued)

*Primary Examiner* — Leslie J Evanisko
(74) *Attorney, Agent, or Firm* — Harness, Dickey & Pierce, P.L.C.

(57) ABSTRACT

Provided is a fabricating method of a pattern, which includes preparing a first substrate having a first width and a first thickness, stretching the first substrate and preparing a second substrate having a second width and a second thickness, forming a base layer made of a material of a pattern which will be formed on the second substrate, removing a predetermined region of the base layer and forming a first pattern having a first line width and a first height on the second substrate, and removing a tensile force applied to the second substrate to restore the second substrate back to being the first substrate and forming a second pattern having a second line width and a second height on the first substrate. Fineness of a line width can be achieved by forming the first pattern in a state in which the substrate is stretched, contracting a line width of the first pattern while
(Continued)

restoring the stretched substrate, and forming the second pattern having a contracted line width on the restored substrate such that high integration can be achieved.

9 Claims, 8 Drawing Sheets

(51) Int. Cl.
 *H01L 21/02* (2006.01)
 *H01L 21/288* (2006.01)
 *H05K 3/12* (2006.01)
(58) Field of Classification Search
 USPC .................................. 101/41, 492, 493, 153
 See application file for complete search history.

(56) References Cited

FOREIGN PATENT DOCUMENTS

| KR | 100840152 B1 | 6/2008 |
| KR | 10-2012-0097413 A | 9/2012 |
| KR | 10-2012-0122400 A | 11/2012 |

OTHER PUBLICATIONS

International Search Report (PCT/ISA/220) for PCT Application No. PCT/KR2018/006886 dated Jun. 19, 2018.
Written Opinion for (PCT/ISA/237) for PCT Application No. PCT/KR2018/006886 dated Jun. 19, 2018.

* cited by examiner

【FIG.1】  -- RELATED ART--
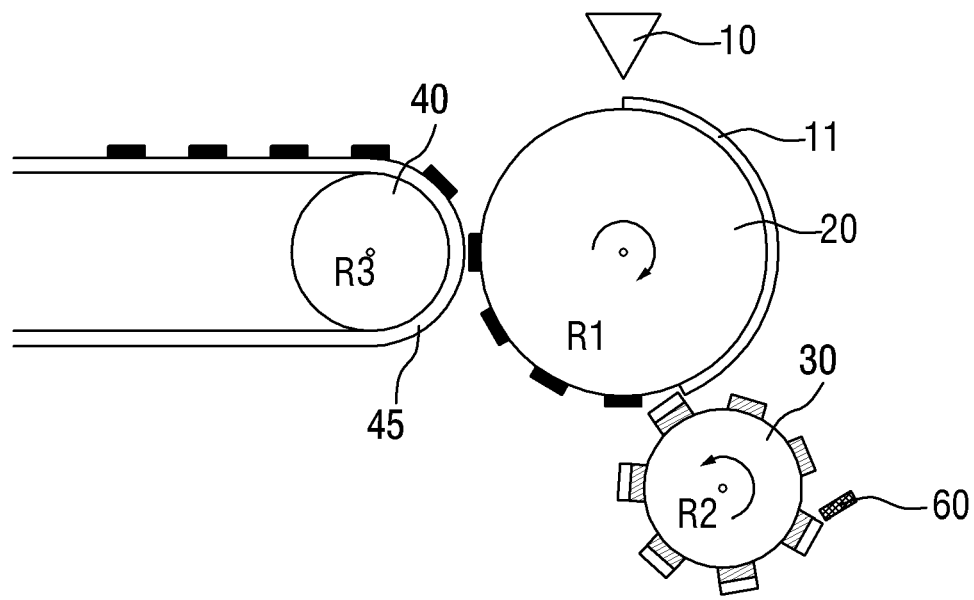
【FIG.2】
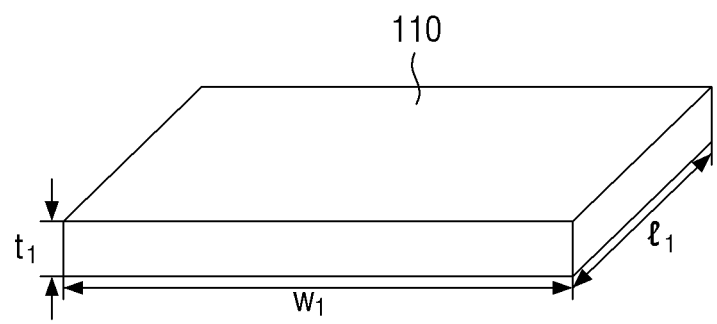
【FIG.3】
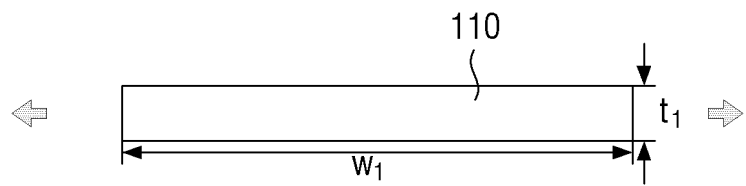

[FIG.4]
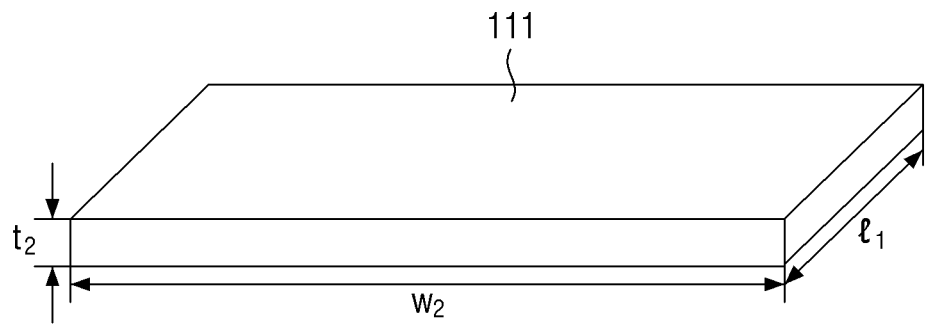
[FIG.5]
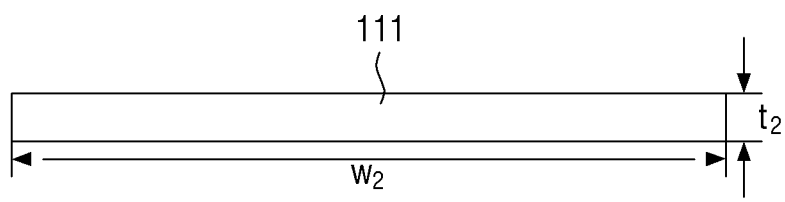
[FIG.6]
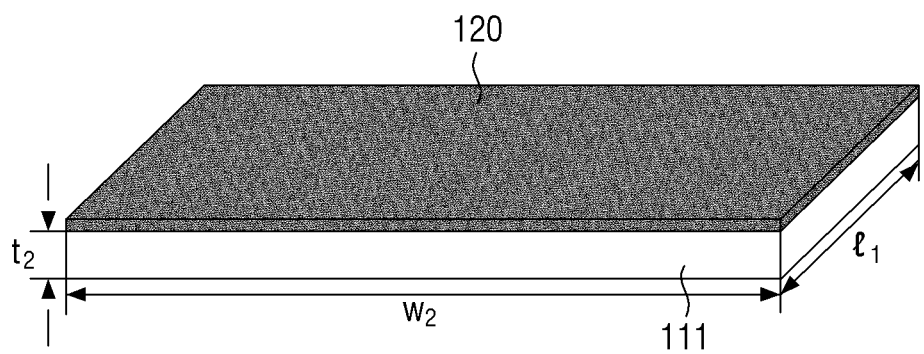
[FIG.7]
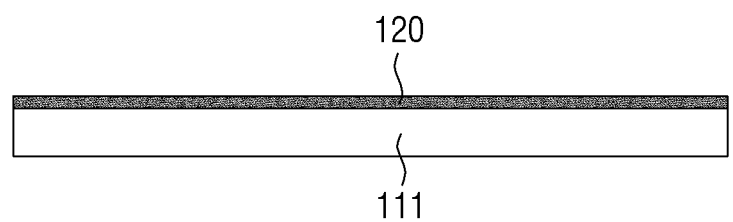

【FIG.8】
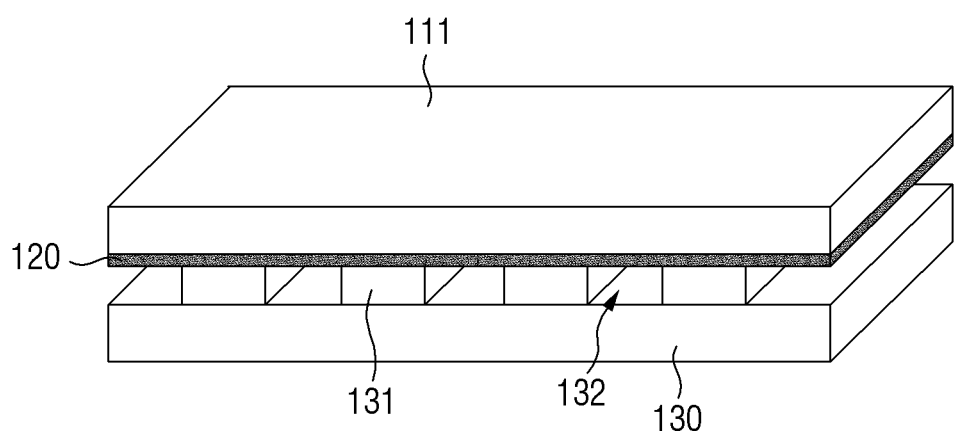
【FIG.9】
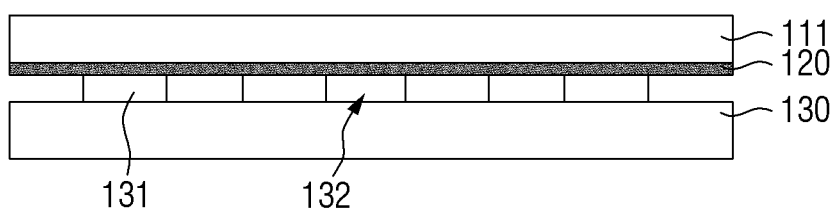

[FIG.10]
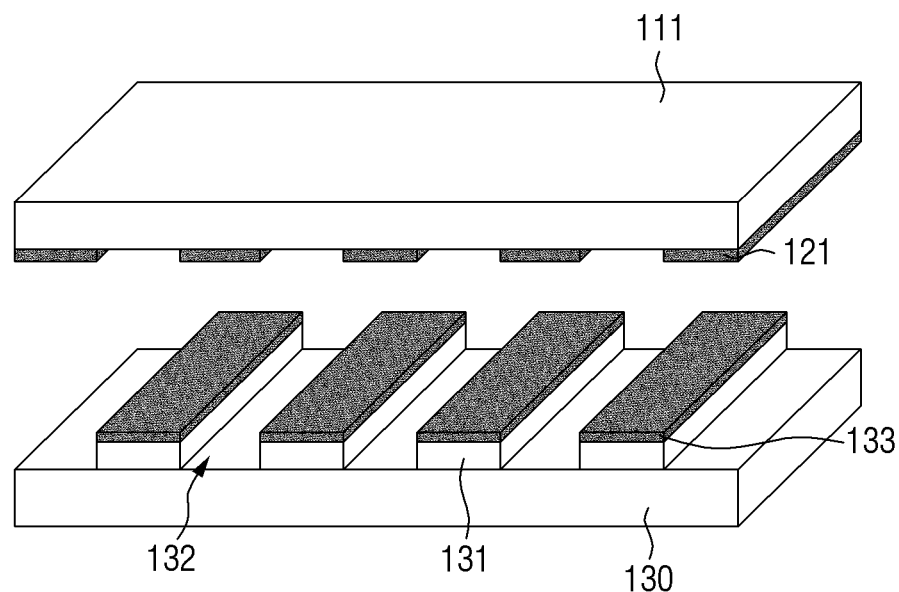
[FIG.11]
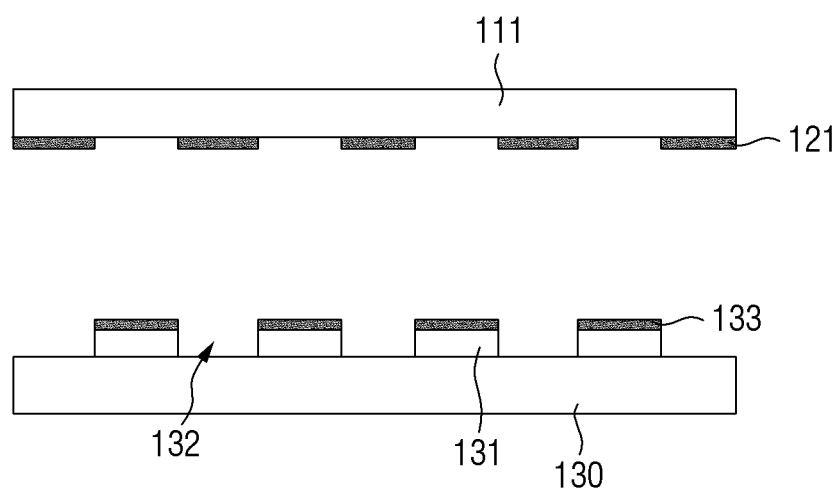

[FIG.12]
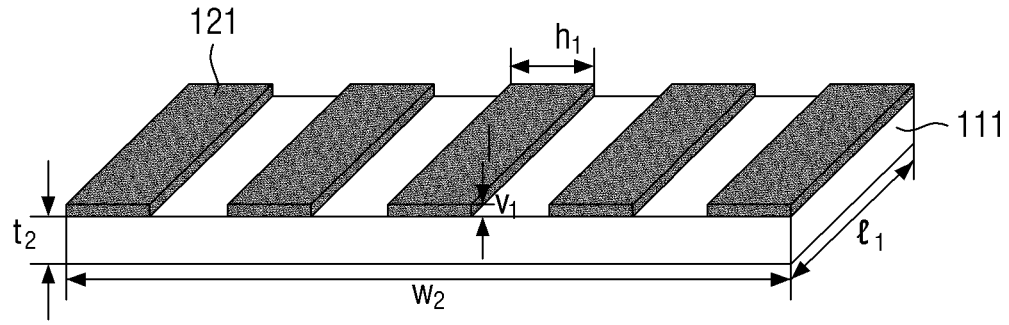
[FIG.13]
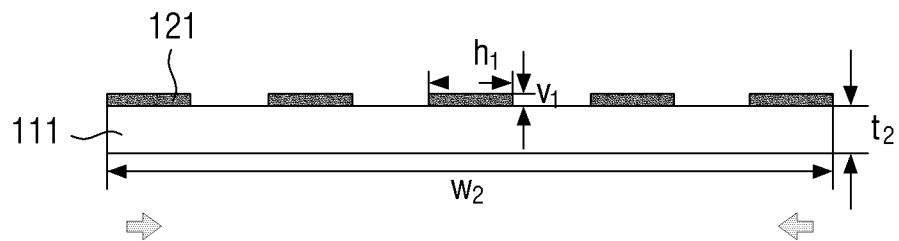
[FIG.14]
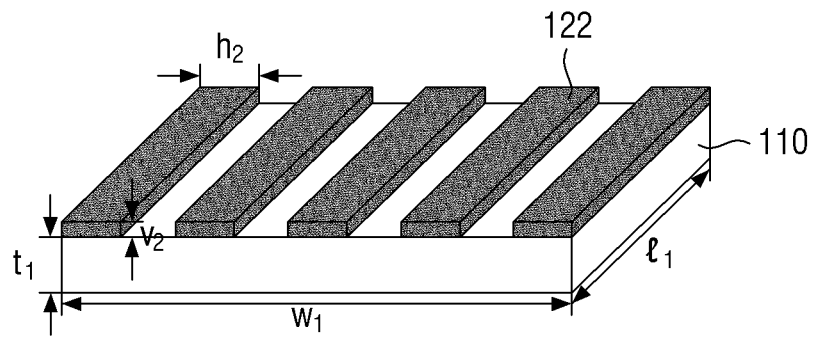
[FIG.15]
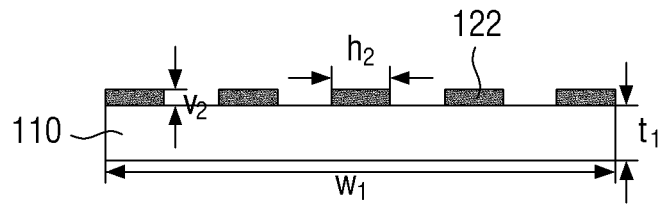

[FIG.16]
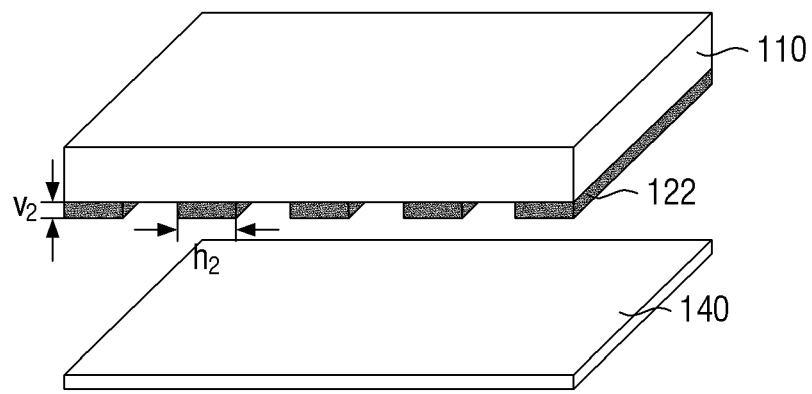
[FIG.17]
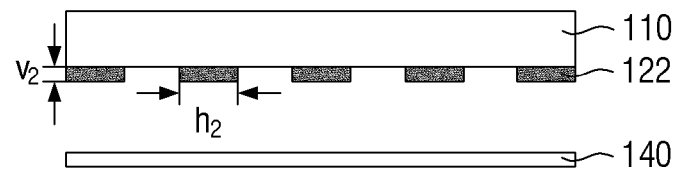
[FIG.18]
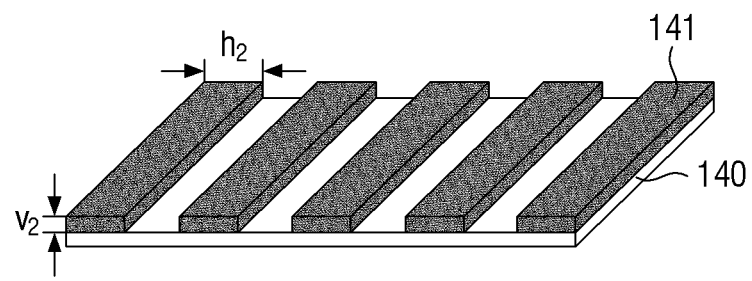
[FIG.19]
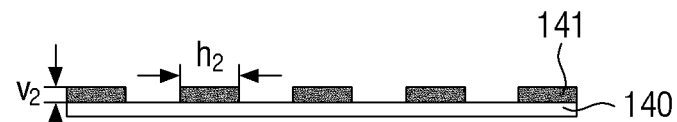

【FIG.20】
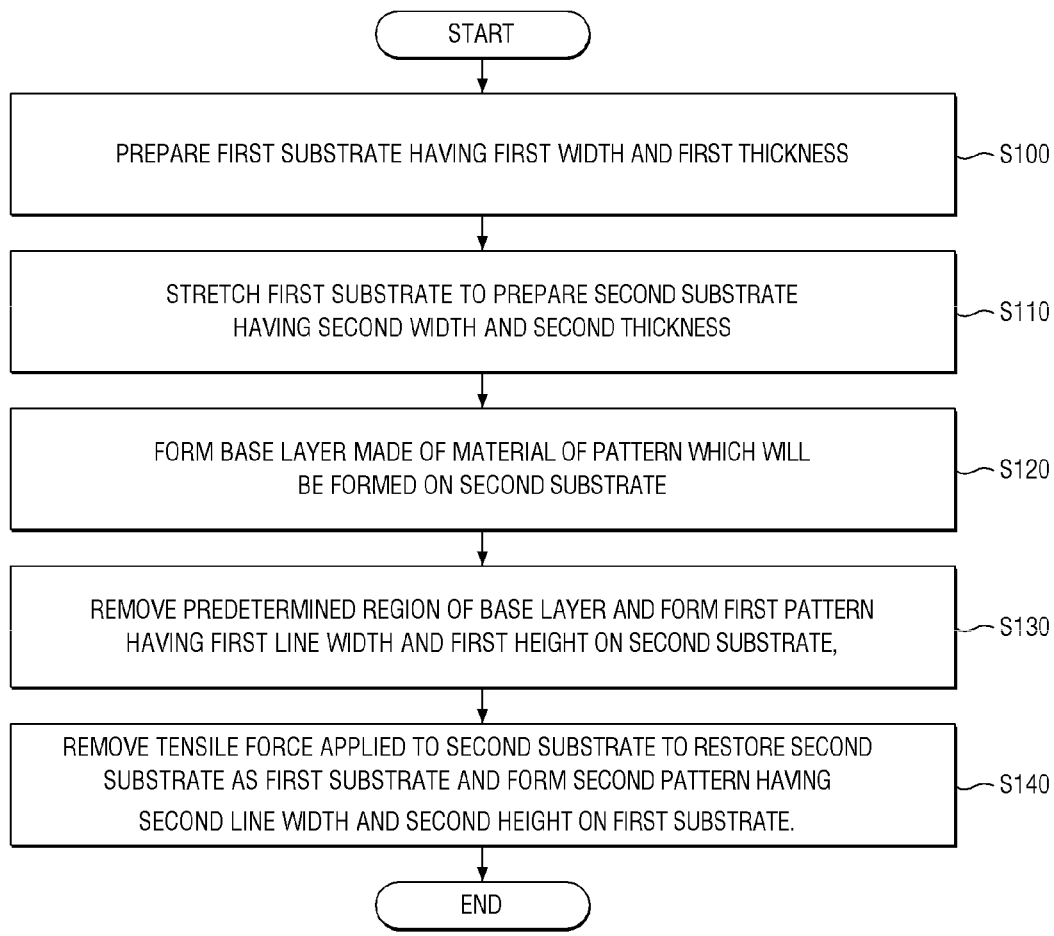
【FIG.21】
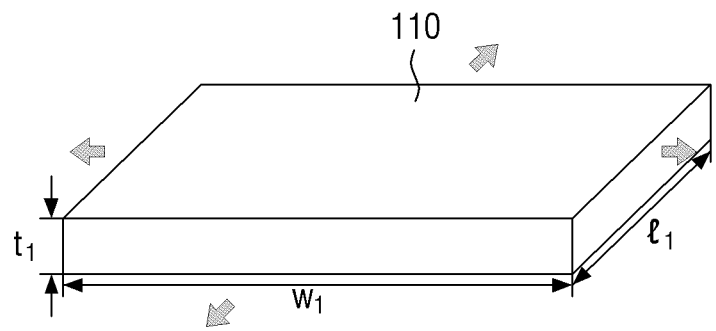

[FIG.22]
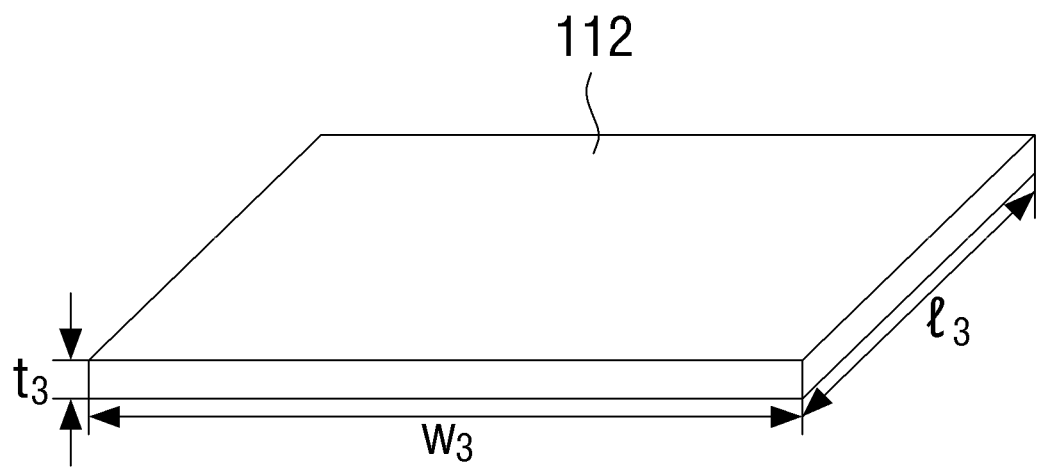

FABRICATING METHOD OF A PATTERN INCLUDING STRETCHING A SUBSTRATE

TECHNICAL FIELD

The present invention relates to a fabricating method of a pattern, and more specifically, to a fabricating method of a pattern, which is capable of achieving fineness or high integration of a pattern.

BACKGROUND ART

Most production processes for semiconductors and electronic products are manufactured in an environment where expensive equipment or advanced process techniques are utilized. Specifically, owing to costs of repeating a process of removing or deforming a material so as to form a thin film on a base material which is a material of a transparent electronic film, there is a limitation to reduction of manufacturing costs for producing a target product so that, in the related industry, it is necessary to reduce production costs of materials and process costs.

Further, a conventional production method of a product according to a patterning process has a problem of being not suitable for mass production because productivity is not high due to complexity of a production process resulting from etching and the like.

As an exemplary example of an electronic printing technique which has been developed for production of the above-described semiconductors and electronic products, a roll-to-roll (R2R) printing process capable of achieving mass production and producing low-cost products is getting attention. The R2R printing process is a process of manufacturing a product by transferring and printing ink onto a base material using a roller on which a circuit is engraved. Unlike an existing process of manufacturing an electronic product, a printing technique for producing general printed matter, such as newspapers, magazines, and the like, is applied to a process for manufacturing electronic products.

The R2R printing process may be a process which is obligatorily used to manufacture display products including an electronic paper (E-paper) and a flexible display, which are examples of products manufactured by the printing technique.

A reverse off-set printing process machine performs a process of coating a printing roller with ink, removing an unprinted pattern using a cliché roller, and transferring a remaining pattern onto a base material.

FIG. 1 is a schematic diagram illustrating an R2R printing apparatus according to a related art.

Referring to FIG. 1, the R2R printing apparatus according to the related art includes a doctor blade 10 for providing a conductive ink, a printing roller 20 (which may be referred to as a "blanket roller") having an outer circumferential surface which is applied, by rotation, with the conductive ink which is provided from the doctor blade and on which a conductive ink layer 11 is formed, a cliché roller 30 configured to be engaged and rotated with the printing roller and remove some portion of the applied conductive ink on the outer circumferential surface of the printing roller to form a shape corresponding to a predetermined pattern on the outer circumferential surface of the printing roller, a cleaning device 60 provided to be brought into contact with an outer circumferential surface of the cliché roller 30 and configured to clean the conductive ink removed from the outer circumferential surface of the printing roller by the cliché roller, and a base substrate roller 40 having an outer circumferential surface on which a base substrate roller 45, which is a pattern formation target, is provided and configured to be engaged and rotated with the printing roller to continuously form the pattern, which is formed on an outer circumferential surface of the printing roller, on a base substrate.

That is, the pattern formed on the outer circumferential surface of the printing roller can be formed on the base substrate by the above-described R2R printing method, and the above-described pattern can be used as a circuit pattern or a line pattern in various circuits.

In this case, the line pattern is required to be finely formed. Specifically, when a plurality of lines are formed in parallel, it is necessary to finely form a line width and a height of a line and a distance between lines.

However, when the conventional R2R printing process is used, there is a problem in that it is difficult to form a line structure having a fine line width and a fine distance between lines due to a process limitation.

DISCLOSURE

Technical Problem

The present invention is directed to providing a fabricating method of a pattern, which is capable of achieving fineness or high integration of a pattern.

It should be noted that objectives of the present invention are not limited to the above-described objectives, and other objectives of the present invention will be apparent to those skilled in the art from the following description.

Technical Solution

One aspect of the present invention provides a fabricating method of a pattern which includes preparing a first substrate having a first width and a first thickness, stretching the first substrate and preparing a second substrate having a second width and a second thickness, forming a base layer made of a material of a pattern which is to be formed on the second substrate, removing a predetermined region of the base layer and forming a first pattern having a first line width and a first height on the second substrate, and removing a tensile force applied to the second substrate to restore the second substrate back to being the first substrate and forming a second pattern having a second line width and a second height on the first substrate.

The fabricating method may further include transferring the second pattern onto a base member.

The stretching of the first substrate may include stretching the first substrate in a width direction of the first substrate.

The second width may be wider than the first width, and the second thickness may be thinner than the first thickness.

The first substrate may be an elastically deformable substrate.

The forming of the first pattern having the first line width and the first height on the second substrate may include preparing a third substrate including a convex portion and a concave portion, disposing the convex portion of the third substrate to be brought into contact with the base layer on the second substrate, and transferring the predetermined region of the base layer onto the convex portion of the third substrate, forming a dummy pattern at the convex portion of the third substrate, and forming the first pattern on the second substrate by a region of the base layer which remains instead of being transferred.

The removing of the tensile force applied to the second substrate to restore the second substrate back to being the first substrate and the forming of the second pattern having the second line width and the second height on the first substrate may include contracting the first line width to be the second line width, and increasing the first height to the second height during the contracting of the first line width to be the second line width.

Another aspect of the present invention provides a fabricating method of a pattern, which includes stretching a substrate and forming a base layer on the stretched substrate, removing a predetermined region of the base layer and forming a first pattern having a first line width and a first height on the stretched substrate, and contracting the stretched substrate and forming a second pattern having a second line width and a second height on the contracted substrate.

The fabricating method may further include transferring the second pattern onto a base member.

The removing of the predetermined region of the base layer and the forming of the first pattern having the first line width and the first height on the stretched substrate may include preparing a third substrate including a convex portion and a concave portion, disposing the convex portion of the third substrate to be brought into contact with the base layer on the stretched substrate, and transferring the predetermined region of the base layer onto the convex portion of the third substrate, forming a dummy pattern at the convex portion of the third substrate, and forming the first pattern on the stretched substrate by a region of the base layer which remains instead of being transferred.

The contracting of the stretched substrate and the forming of the second pattern having the second line width and the second height on the retracted substrate may include contracting the first line width to be the second line width, and increasing the first height to the second height during the contracting of the first line width to be the second line width.

Advantageous Effects

According to the present invention, fineness of a line width can be achieved by forming a first pattern in a state in which a substrate is stretched, contracting a line width of the first pattern while restoring the stretched substrate, and forming a second pattern having a contracted line width on the restored substrate such that high integration can be achieved.

Further, according to the present invention, a height of a pattern is increased while a line width of the pattern is contracted such that a fine pattern having a high aspect ratio can be formed.

DESCRIPTION OF DRAWINGS

FIG. 1 is a schematic diagram illustrating a roll-to-roll (R2R) printing apparatus according to a related art.

FIGS. 2 to 19 are schematic diagrams for describing a fabricating method of a pattern according to the present invention.

FIG. 20 is a flowchart for describing the fabricating method of a pattern according to the present invention.

FIGS. 21 and 22 are schematic diagrams for describing a case in which a first substrate is stretched in a width direction and a length direction.

MODES OF THE INVENTION

Advantages, features, and implementations thereof will be apparent from embodiments which are described in detail below together with the accompanying drawings. The present invention may, however, be implemented in many different forms and should not be construed as being limited to the embodiments set forth herein, and the embodiments are provided such that this disclosure will be thorough and complete and will fully convey the scope of the present invention to those skilled in the art to which the present invention pertains, and the present invention is defined by only the scope of the appended claims.

A description for implementing the present invention will be made in detail below with reference to the accompanying drawings. Throughout the drawings, the same reference numeral refers to the same component, and the term "and/or" includes each of described items and one or more combinations thereof.

Although the terms first, second, and the like are used to describe various components, these components are substantially not limited by these terms. These terms are used only to distinguish one component from another component. Therefore, a first component described below may be substantially a second component within the technical spirit of the present invention.

Terms used herein are intended to describe embodiments and are not intended to limit the present invention. In this disclosure, the singular forms include the plural forms unless the context clearly dictates otherwise. It is noted that the terms "comprises" and/or "comprising" used herein does not exclude the presence or addition of one or more other components in addition to stated components.

Unless defined otherwise, all terms (including technical and scientific terms) used herein may be used in a sense commonly understood by those skilled in the art to which this present disclosure pertains. Further, terms which are defined in a commonly used dictionary are not ideally or excessively interpreted unless explicitly defined otherwise.

As shown in the drawings, spatially relative terms "below," "beneath," "lower," "above," "upper," and the like can be used to easily describe a correlation between one element and another element. In addition to a direction shown in the drawings, the spatially relative terms should be understood as terms including different directions of components when the components are used or operated. For example, when a component element shown in the drawing is inverted, the component described as being "below" or "beneath" another component may be disposed "above" another component. Consequently, the exemplary term "below" can include all of downward and upward directions. A component can be oriented in a different direction so that the spatially relative terms can be interpreted according to the orientation.

Hereinafter, exemplary embodiments of the present invention will be described in detail with reference to the accompanying drawings.

FIGS. 2 to 19 are schematic diagrams for describing a fabricating method of a pattern according to the present invention, and FIG. 20 is a flowchart for describing the fabricating method of a pattern according to the present invention.

Meanwhile, a pattern in the present invention may be a general circuit pattern or a line pattern. Alternatively, the pattern may be an insulating layer pattern or a semiconductor layer pattern. Accordingly, a type of the pattern is not limited in the present invention.

Referring to FIGS. 2, 3, and 20 first, the fabricating method of a pattern according to the present invention includes preparing a first substrate 110 having a first width $W_1$ and a first thickness $t_1$ (S100).

Further, the first substrate 110 may have a first length $l_1$.

In the present invention, the first substrate 110 is an elastically deformable substrate. The first substrate 110 may employ at least one material among latex, polyurethane, polydimethylsiloxane (PDMS), polyurethane acrylate (PUA), perfluoropolyether (PFPE), polyethylene (PE), spandex, Gore-Tex, polychloroprene, styrene-butadiene rubber (SBR), acrylonitrile-butadiene rubber (NBR), butyl rubber, ethylene propylene rubber (EPR), thiokol, and silicone rubber. However, in the present invention, the first substrate 110 is not limited to a material of the first substrate in the present invention on the assumption that the first substrate 110 is an elastically deformable substrate.

Further, in the drawing, the first substrate has been illustrated as a plate type substrate, but alternatively, the first substrate may be a roll type substrate as shown in FIG. 1. Thus, when the first substrate is a roll type substrate, the first substrate may be referred to as a printing roller or a blanket roller. Therefore, a shape of the first substrate is not limited in the present invention.

Meanwhile, as described below, the first substrate serves to transfer a predetermined pattern onto another substrate after the predetermined pattern is formed so that, for convenience of description, the first substrate may be referred to as a transfer substrate.

Next, referring to FIGS. 4, 5, and 20, the fabricating method of a pattern according to the present invention includes stretching the first substrate 110 to prepare a second substrate 111 having a second width $W_2$ and a second thickness $t_2$ (S110).

That is, in the present invention, since the first substrate is stretched to prepare the second substrate, the second width $W_2$ is wider than the first width $W_1$, and the second thickness $t_2$ is thinner than the first thickness $t_1$.

In the present invention, for convenience of explanation, the first substrate and the second substrate are referred to separately, but it is natural that the first substrate and the second substrate are the same substrate only differing in shape.

In the present invention, the reason for being capable of preparing the second substrate by stretching the first substrate is that, as described above, the first substrate may be made of an elastically deformable material. Therefore, in the present invention, the first substrate should be made of an elastically deformable material.

In this case, the stretching of the first substrate 110 may include preparing a stretched first substrate, i.e., the second substrate 111 having the second width $W_2$ and a second thickness $t_2$ by applying a force for stretching the first substrate in a width direction thereof, i.e., a tensile force.

Meanwhile, FIGS. 4 and 5 illustrate that the first substrate 110 is stretched in the width direction thereof. Accordingly, the second substrate 111 may have a first length $l_1$ identical to that of the first substrate 110.

Alternatively, in the present invention, the first substrate may be stretched not only in the width direction of the first substrate, but also in a length direction of the first substrate.

FIGS. 21 and 22 are schematic diagrams for describing a case in which a first substrate is stretched in a width direction and a length direction.

That is, as shown in FIG. 21, the first substrate 110 may have the first width $W_1$, the first thickness $t_1$, and the first length $l_1$. In this case, when the first substrate 110 is stretched in the width direction and the length direction thereof, as shown in FIG. 22, a second substrate 112 may have a third width $W_3$, a third thickness $t_3$, and a third length $l_3$.

In FIGS. 21 and 22, since the first substrate is stretched to prepare the second substrate, the third width $W_3$ is wider than the first width $W_1$, the third thickness $t_3$ is thinner than the first thickness $t_1$, and the third length $l_3$ is longer than the first length $l_1$.

As described above, in the present invention, a direction in which the first substrate is stretched is not limited. However, as described below, since the present invention is for finely forming a width of the pattern, the first substrate may be preferably stretched in the width direction thereof.

Next, referring to FIGS. 6, 7, and 20, the fabricating method of a pattern according to the present invention includes forming a base layer 120 made of a material of a pattern which will be formed on the second substrate 111 (S120).

A material of the base layer 120 may be changed according to a kind of a pattern which will be formed. For example, the base layer 120 may be the above-described conductive ink layer of FIG. 1. Therefore, the material of the base layer 120 is not limited in the present invention.

Further, the base layer 120 may be formed by known coating, known printing, or known vapor deposition method. For example, the base layer 120 may be formed by coating using a doctor blade as in the above-described fabricating method of the conductive ink layer of FIG. 1. Therefore, a fabricating method of the base layer 120 is not limited in the present invention.

Next, referring to FIGS. 5 to 7 and 20, the fabricating method of a pattern according to the present invention includes removing a predetermined region of the base layer 120 and forming a first pattern 121 on the second substrate 110 (S130).

More specifically, referring to FIGS. 8 and 9, the forming of the first pattern 121 on the second substrate 110 includes first providing a third substrate 130 including a convex portion 131 and a concave portion 132 and disposing the convex portion 131 of the third substrate 130 to be brought into contact with the base layer 120 on the second substrate 110.

Meanwhile, since the third substrate serves to remove the predetermined region of the base layer 120, the third substrate may be referred to as a cliché substrate.

In this case, in the drawing, the third substrate 130 has been illustrated as a plate type substrate, but alternatively, the third substrate 130 may be the above-described roll type substrate as shown in FIG. 1. Thus, when the third substrate is a roll type substrate, the third substrate may be referred to as a cliché roller. Therefore, a shape of the third substrate is not limited in the present invention.

Next, the forming of the first pattern 121 on the second substrate 110 includes transferring the predetermined region of the base layer 120 onto the convex portion 131 of the third substrate 130, forming a dummy pattern 133 at the convex portion 131 of the third substrate 130, and forming the first pattern 121 on the second substrate 110 by a region of the base layer 120 which remains instead of being transferred.

Consequently, as shown in FIGS. 12 and 13, the first pattern 121 may be formed on the second substrate 110.

In this case, as described above, the second substrate 110 has the second width $W_2$ and the second thickness $t_2$, and the first pattern 121 formed on the second substrate 110 has a first line width $h_1$ in a horizontal direction and a first height $V_1$ in a vertical direction.

Next, referring to FIGS. 14, 15, and 20, the fabricating method of a pattern according to the present invention includes being restored back to the first substrate 110 by removing a tensile force applied to the second substrate 111 (S140).

Further, through operation S140, a second pattern 122 including a second line width $h_2$ and a second height $V_2$ is formed on the first substrate 110.

That is, as shown in FIGS. 14 and 15, the tensile force applied to the second substrate 111 is removed such that the second substrate having the second width $W_2$ and the second thickness $t_2$ may be contracted and restored back to being the first substrate 110 having the first width $W_1$ and the first thickness $t_1$.

Meanwhile, in the present invention, it is an ideal form when the second substrate having the second width $W_2$ and the second thickness $t_2$ is contracted and restored back to being the first substrate 110 having the first width $W_1$ and the first thickness $t_1$. However, the second width $W_2$ and the second thickness $t_2$ may not be fully restored back to being the first width $W_1$ and first thickness $t_1$.

That is, when the first width $W_1$ and the first thickness $t_1$ are deformed to be the second width $W_2$ and the second thickness $t_2$, and then the second width $W_2$ and the second thickness $t_2$ are restored back to being the first width $W_1$ and the first thickness $t_1$, a permanent deformation value which is not restored may be present such that the second width $W_2$ and the second thickness $t_2$ may be deformed to be a first-first width $W_{1-1}$ and a first-first thickness $t_{1-1}$ which are different from the first width $W_1$ and the first thickness $t_1$.

In this case, the second width $W_2$ may be wider than the first width $W_1$, the second thickness $t_2$ may be thinner than the first thickness $t_1$, the second width $W_2$ may be wider than the first-first width $W_{1-1}$, the second thickness $t_2$ may be thinner than the first-first thickness $t_{1-1}$, the first-first width $W_{1-1}$ may be narrower than the first width $W_1$, and the first-first thickness $t_{1-1}$ may be thinner than the first thickness $t_1$.

However, on the assumption of a most ideal form, it is described below that the second substrate having the second width $W_2$ and the second thickness $t_2$ is contracted and restored back to being the first substrate 110 having the first width $W_1$ and the first thickness $t_1$.

Referring to FIGS. 14 and 15, in a state in which the second substrate 110 has the second width $W_2$ and the second thickness $t_2$, the second substrate 110 is restored back to being the first substrate 110 having the first width $W_1$ and the first thickness $t_1$, and the first pattern 121 formed on the second substrate 110 is also deformed such that the second pattern 122 which is the deformed first pattern may be formed on the first substrate 110.

Therefore, as described above, the second pattern 122 formed on the first substrate 110 has a second line width $h_2$ in the horizontal direction and a second height $V_2$ in the vertical direction.

In this case, as the second substrate is contracted and restored back to being the first substrate, the first line width $h_1$ of the first pattern 121 is also contracted.

Accordingly, the first pattern 121 has the first line width $h_1$, but the second pattern 122 has the second line width $h_2$ because the first line width $h_1$ is contracted such that the second line width $h_2$ becomes narrower than the first line width $h_1$.

As described above, when the conventional R2R printing process is used, there is a problem in that it is difficult to form a pattern structure having a fine line width and a fine distance between patterns due to a process limitation.

However, in the present invention, fineness of a line width can be achieved by forming a first pattern in a state in which a substrate is stretched, contracting a line width of the first pattern while restoring the stretched substrate, and forming a second pattern having a contracted line width on the restored substrate.

For example, a line width of the first pattern may be implemented with a range of 10 μm or more, and a line width of the second pattern formed on the restored substrate may be implemented with a range of 1 μm or less.

Further, in the present invention, as the first line width $h_1$ is contracted to be the second line width $h_2$, the second height $V_2$ becomes higher.

That is, the first height $V_1$ of the first pattern is deformed to be the second height $V_2$ by corresponding to an amount of the first line width $h_1$ contracted and deformed to be the second line width $h_2$ such that the second pattern 122 having the second height $V_2$ may be formed.

Accordingly, in the present invention, a pattern in which a line width is reduced, a gap between patterns is reduced, and a height is increased may be implemented such that a fine pattern having a high aspect ratio may be formed.

Next, referring to FIGS. 16 and 17, the fabricating method of a pattern according to the present invention may further include transferring the second pattern 122 formed on the first substrate 110 onto a base member 140.

The base member may employ a general substrate used in the field of semiconductors, displays, solar cells, and the like without limitation. For example, the base member may be made of an inorganic material such as silicon, gallium arsenide (GaAs), gallium phosphorus (GaP), gallium arsenide phosphorus (GaAsP), silica, sapphire, quartz, a glass substrate, or the like, or a transparent polymer such as polycarbonate, polyethylene naphthalate, polynorbornene, polyacrylate, polyvinyl alcohol, polyimide, polyethylene terephthalate, polyether cellphone, or the like. Therefore, the material of the base member is not limited in the present invention.

Thus, as shown in FIGS. 18 and 19, the base member 140 including a transfer pattern 141 may be prepared. Since the transfer pattern 141 is formed by transferring the second pattern 122, like the second pattern, the transfer pattern 141 has the second line width $h_2$ and the second height $V_2$.

The above-described fabricating method of a pattern according to the present invention may be summarized as follows.

That is, the fabricating method of a pattern according to the present invention includes stretching a substrate and forming a base layer on the stretched substrate, removing a predetermined region of the base layer and forming a first pattern having a first line width $h_1$ and a first height $V_1$ on the stretched substrate, and contracting the stretched substrate and forming a second pattern having a second line width $h_2$ and a second height $V_2$ on the retracted substrate. The fabricating method of a pattern further includes transferring the second pattern onto a base member.

As described above, according to the present invention, fineness of a line width can be achieved by forming the first pattern in a state in which the substrate is stretched, contracting a line width of the first pattern while restoring the stretched substrate, and forming the second pattern having a contracted line width on the restored substrate.

Further, according to the present invention, a height of a pattern is increased while a line width of the pattern is contracted such that a fine pattern having a high aspect ratio can be formed.

While the embodiments of the present invention have been described with reference to the accompanying drawings, those skilled in the art can understand that the present invention can be implemented in other specific forms without departing from the technical spirit or the necessary features of the present invention. Therefore, it should be understood that the above-described embodiments are not restrictive but illustrative in all aspects.

The invention claimed is:

1. A fabricating method of a pattern, comprising:
preparing a first substrate having a first width and a first thickness;
stretching the first substrate and preparing a second substrate having a second width and a second thickness;
forming a base layer made of a material of a pattern which is to be formed on the second substrate;
removing a predetermined region of the base layer and forming a first pattern having a first line width and a first height on the second substrate;
removing a tensile force applied to the second substrate to restore the second substrate back to being the first substrate and forming a second pattern having a second line width and a second height on the first substrate; and
transferring the second pattern onto a base member.

2. The fabricating method of claim 1, wherein the stretching of the first substrate includes stretching the first substrate in a width direction of the first substrate.

3. The fabricating method of claim 1, wherein the second width is wider than the first width, and the second thickness is thinner than the first thickness.

4. The fabricating method of claim 1, wherein the first substrate is an elastically deformable substrate.

5. The fabricating method of claim 1, wherein the forming of the first pattern having the first line width and the first height on the second substrate includes:
preparing a third substrate including a convex portion and a concave portion;
disposing the convex portion of the third substrate to be brought into contact with the base layer on the second substrate; and
transferring the predetermined region of the base layer onto the convex portion of the third substrate, forming a dummy pattern at the convex portion of the third substrate, and forming the first pattern on the second substrate by a region of the base layer which remains instead of being transferred.

6. The fabricating method of claim 1, wherein the removing of the tensile force applied to the second substrate to restore the second substrate back to being the first substrate and the forming of the second pattern having the second line width and the second height on the first substrate includes:
contracting the first line width to be the second line width; and
increasing the first height to the second height during the contracting of the first line width to be the second line width.

7. A fabricating method of a pattern, comprising:
stretching a substrate and forming a base layer on the stretched substrate;
removing a predetermined region of the base layer and forming a first pattern having a first line width and a first height on the stretched substrate;
contracting the stretched substrate and forming a second pattern having a second line width and a second height on the contracted substrate; and
transferring the second pattern onto a base member.

8. The fabricating method of claim 7, wherein the removing of the predetermined region of the base layer and the forming of the first pattern having the first line width and the first height on the stretched substrate includes:
preparing a third substrate including a convex portion and a concave portion;
disposing the convex portion of the third substrate to be brought into contact with the base layer on the stretched substrate; and
transferring the predetermined region of the base layer onto the convex portion of the third substrate, forming a dummy pattern at the convex portion of the third substrate, and forming the first pattern on the stretched substrate by a region of the base layer which remains instead of being transferred.

9. The fabricating method of claim 7, wherein the contracting of the stretched substrate and the forming of the second pattern having the second line width and the second height on the retracted substrate includes:
contracting the first line width to be the second line width; and
increasing the first height to the second height during the contracting of the first line width to be the second line width.

* * * * *